(12) United States Patent
Yamaguchi

(10) Patent No.: US 10,629,622 B2
(45) Date of Patent: Apr. 21, 2020

(54) DISPLAY DEVICE AND MANUFACTURING METHOD THEREOF

(71) Applicant: Japan Display Inc., Minato-ku (JP)

(72) Inventor: Yohei Yamaguchi, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/051,532

(22) Filed: Aug. 1, 2018

(65) Prior Publication Data

US 2019/0067334 A1 Feb. 28, 2019

(30) Foreign Application Priority Data

Aug. 31, 2017 (JP) .................. 2017-166818

(51) Int. Cl.
| | | |
|---|---|---|
| *H01L 27/12* | (2006.01) | |
| *H01L 29/40* | (2006.01) | |
| *H01L 29/423* | (2006.01) | |
| *H01L 29/66* | (2006.01) | |
| *H01L 29/786* | (2006.01) | |
| *G02F 1/1343* | (2006.01) | |
| *G02F 1/1368* | (2006.01) | |

(Continued)

(52) U.S. Cl.
CPC ........ *H01L 27/1218* (2013.01); *G02F 1/1343* (2013.01); *G02F 1/1368* (2013.01); *G09G 3/36* (2013.01); *H01L 27/127* (2013.01); *H01L 27/1222* (2013.01); *H01L 27/1248* (2013.01); *H01L 27/1259* (2013.01); *H01L 29/66969* (2013.01); *H01L 29/7869* (2013.01); *H01L 29/78648* (2013.01); *G09G 2360/04* (2013.01); *H01L 27/01* (2013.01); *H01L 27/1214* (2013.01)

(58) Field of Classification Search
CPC .... G09G 3/36; G09G 2360/04; G02F 1/1343; G02F 1/1368; H01L 27/01; H01L 27/1214; H01L 27/1218; H01L 27/1222; H01L 27/1248; H01L 27/1259; H01L 27/127; H01L 27/3262; H01L 2251/303
See application file for complete search history.

(56) References Cited

U.S. PATENT DOCUMENTS

| | | | |
|---|---|---|---|
| 5,940,732 A | 8/1999 | Zhang | |
| 10,249,761 B2* | 4/2019 | Yoshitani | ............ H01L 27/3262 |
| 10,317,763 B2* | 6/2019 | Watakabe | ............. G02F 1/1368 |

(Continued)

FOREIGN PATENT DOCUMENTS

JP  9-213968  8/1997

*Primary Examiner* — Mohsen Ahmadi
(74) *Attorney, Agent, or Firm* — Oblon, McClelland, Maier & Neustadt, L.L.P.

(57) ABSTRACT

The purpose of the invention is to form a stable oxide semiconductor TFT in a display device. The concrete structure is: A display device having a TFT substrate that includes a TFT having an oxide semiconductor layer comprising: the oxide semiconductor layer is formed on a first insulating film that is formed by a silicon oxide layer, the oxide semiconductor layer and an aluminum oxide film are directly formed on the first insulating film. The first insulating film becomes oxygen rich when the aluminum oxide film is formed on the first insulating film by sputtering. Oxygens in the first insulating film is effectively confined in the first insulating film, eventually, the oxygens diffuse to the oxide semiconductor for a stable operation of the oxide semiconductor TFT.

13 Claims, 11 Drawing Sheets

(51) Int. Cl.
*G09G 3/36* (2006.01)
*H01L 27/01* (2006.01)

(56) References Cited

U.S. PATENT DOCUMENTS

| | | | |
|---|---|---|---|
| 2014/0239267 A1* | 8/2014 | Byun | H01L 29/66742 257/40 |
| 2016/0064425 A1* | 3/2016 | Kim | H01L 27/1255 438/151 |
| 2016/0300954 A1* | 10/2016 | Sasaki | H01L 21/32105 |
| 2017/0110686 A1* | 4/2017 | Kamiya | H01L 27/322 |
| 2017/0279084 A1* | 9/2017 | Sakamoto | H01L 27/322 |
| 2018/0286890 A1* | 10/2018 | Suzumura | H01L 27/1248 |

* cited by examiner

DISPLAY DEVICE AND MANUFACTURING METHOD THEREOF

CLAIM OF PRIORITY

The present application claims priority from Japanese Patent Application JP 2017-166818 filed on Aug. 31, 2017, the content of which is hereby incorporated by reference into this application.

BACKGROUND OF THE INVENTION

(1) Field of the Invention

The present invention relates to a display device having an oxide semiconductor TFT characterized in that a leak current due to deoxidization of the oxide semiconductor is suppressed.

(2) Description of the Related Art

A liquid crystal display device has a TFT substrate, a counter substrate opposing to the TFT substrate and a liquid crystal layer sandwiched between the TFT substrate and the counter substrate. The TFT substrate has plural pixels; each of the pixels has a pixel electrode and a thin film transistor (TFT). A transmittance of light in each of the pixels is controlled by liquid crystal molecules; thus, images are formed. On the other hand, an organic EL display device has a self-illuminant organic EL layer and a TFT in each of the pixels, thus, color images are formed. The organic EL display device does not need the back light, thus, it is advantageous in forming a flexible display device.

In a display device, the TFTs are used for switching elements in the pixels, or used in the peripheral driving circuit. Since the TFT of the oxide semiconductor has a high OFF resistance, it is suitable for a switching transistor. Furthermore, the TFT of the oxide semiconductor has an advantage that it can be manufactured relatively in low temperature compared with the TFT of poly-Si.

Several insulating films are used as interlayer insulating films in the display device. Many of them are a silicon oxide (herein after called by SiO in this specification) film or a silicon nitride (herein after called by SiN in this specification); sometimes, an aluminum oxide film is also used. The patent document 1 (Japanese patent application laid open No. Hei 9-213968) discloses to form the gate electrode by aluminum; the surface of the aluminum is transformed to the aluminum oxide by anode oxidization; thus adherence between the gate electrode and the resist is improved. The patent document 1 further discloses that when the through hole is formed, the aluminum oxide in the through hole is removed by etching.

SUMMARY OF THE INVENTION

In the TFT of the oxide semiconductor, a leak current increases when the resistance of the oxide semiconductor at the channel decreases due to deoxidization of the oxide semiconductor. The deoxidization of the oxide semiconductor occurs when oxygens are extracted by metal and the like, or hydrogens are supplied to the oxide semiconductor from the layer formed by SiN, etc.

One method to prevent the oxide semiconductor from being reduced is to dispose the SiO film in contact with the oxide semiconductor; and to supply oxygens to the oxide semiconductor from the SiO film. The SiO film must be oxygen rich in order to supply oxygens to the oxide semiconductor. The oxygen rich structure, however, contains a lot of defects; thus, the SiO film cannot maintain enough insulating characteristics. Furthermore, even the SiO film contains a lot of oxygens, the oxygens may escape to other portions; in that case, enough oxygens may not be supplied to the oxide semiconductor.

The purpose of the present invention is to realize the structure that the oxygen rich SiO film is disposed in contact with the oxide semiconductor to supply enough oxygens from the SiO film to the oxide semiconductor; consequently, to realize the oxide semiconductor TFT that has low leak current at the same time.

The present invention overcomes the above explained problem; the concrete structures are as follows.

A display device having a TFT substrate that includes a TFT having an oxide semiconductor layer comprising: the oxide semiconductor layer is formed on a first insulating film that is formed by a silicon oxide layer; the oxide semiconductor layer and an aluminum oxide film are directly formed on the first insulating film. In other words, oxygens in the first insulating film are effectively confined in the first insulating film by the aluminum oxide film; and consequently, oxygens in the first insulating film are efficiently supplied to the oxide semiconductor layer.

DETAILED DESCRIPTION OF THE PREFERRED EMBODIMENTS

The present invention will be described in detail referring to the following embodiments. In the explanation below, the invention is mainly explained in an example of the liquid crystal display device; however, the present invention is applicable to the organic EL display device, too.

Embodiment 1

Figure 1:
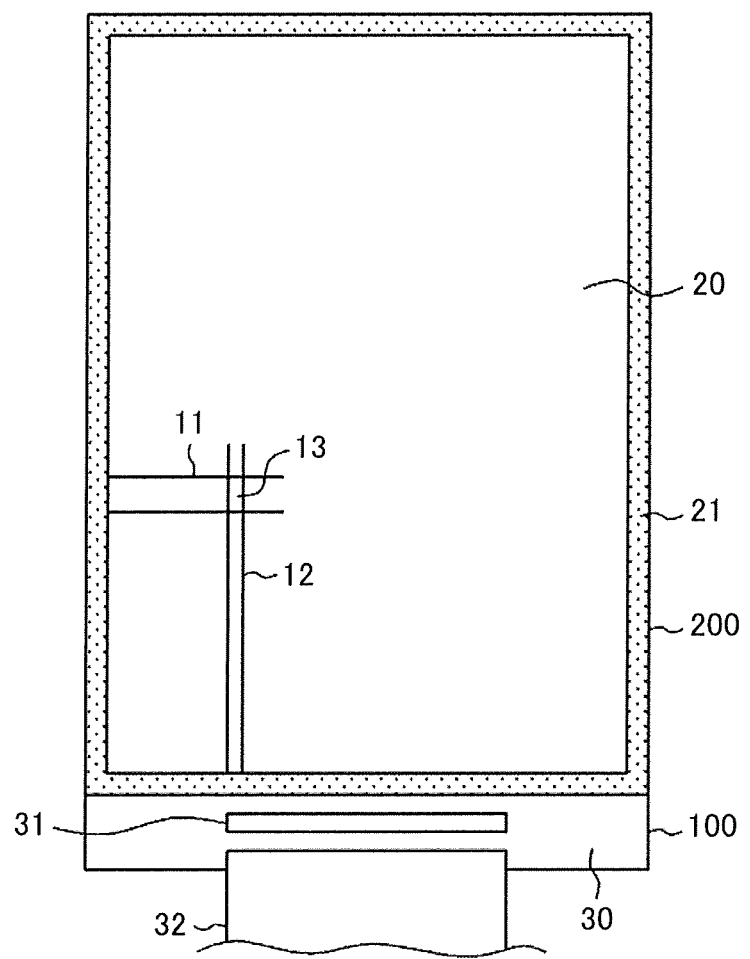
FIG. 1 is a plan view of the liquid crystal display device.

FIG. 1 is a plan view of a liquid crystal display device, which the present invention is applied. In FIG. 1, the TFT substrate 100, on which the TFTs and pixel electrodes are formed, and the counter substrate 100 adhere to each other at their periphery by sealing material 21; the liquid crystal is encapsulated between the TFT substrate 100 and the counter substrate 200. The display area 20 is formed in the area surrounded by the sealing material 21.

In FIG. 1, the TFT substrate 100 is made bigger than the counter substrate 200; the area of the TFT substrate 100 where the counter substrate 200 does not overlap is the terminal area 30; the driver IC 31 is installed on the terminal area 30. The flexible wiring circuit substrate 32, which supplies powers or signals to the liquid crystal display device, connects to the terminal 30.

In the display area 20 in FIG. 1, the scanning lines 11 extend in the lateral direction (x direction) and are arranged in the longitudinal direction (y direction). The video signal lines 12 extend in the longitudinal direction (y direction) and are arranged in the lateral direction (x direction). Video signals are sent to the video signal lines 12 from the driver IC 31, which is installed on the terminal area 30. The pixel 13 is formed in the area surrounded by the scanning lines 11 and the video signal lines 12.

In the liquid crystal display device of FIG. 1 uses a TFT, which is constituted by the oxide semiconductor. The oxide semiconductor has an advantage of low leak current. Therefore, it is suitable for a switching element in the pixel in the display area. On the other hand, the TFT constituted by the poly silicon has larger leak current, however, the poly silicon has a high mobility, thus, the poly silicon is used often for a TFT in the peripheral driving circuit.

Figure 2:
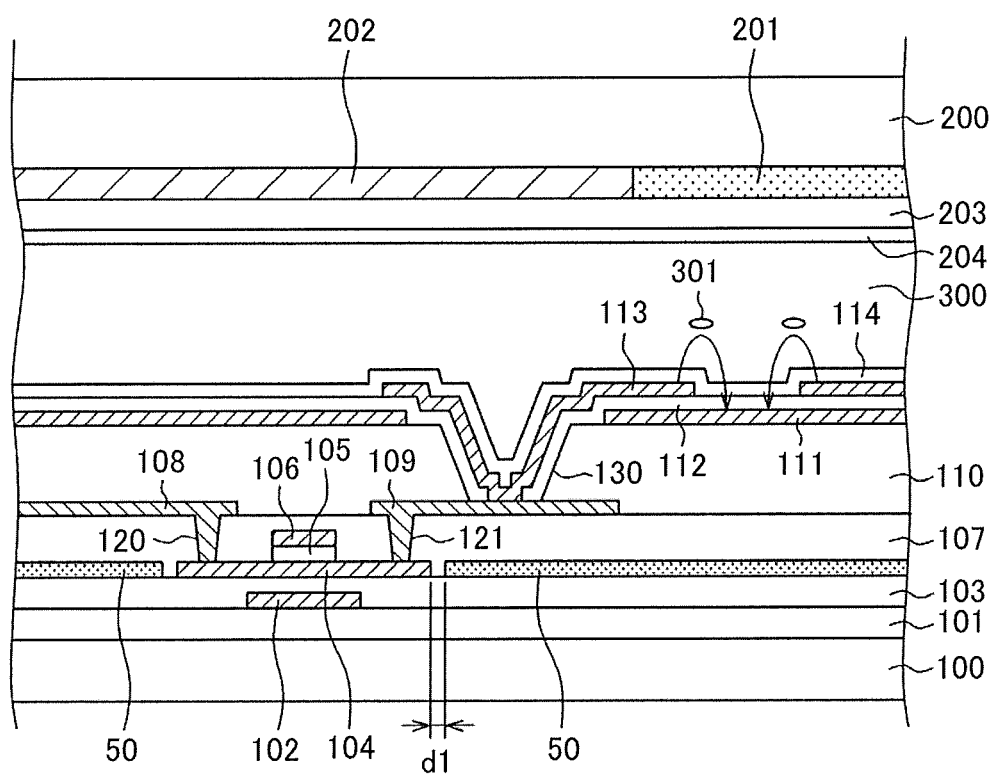
FIG. 2 is a cross sectional view of the display area of the liquid crystal display device.

FIG. 2 is a cross sectional view of the display area 20 of the liquid crystal display device in FIG. 1. The oxide semiconductor layer 104 is used in the TFT in FIG. 2. The TFT of the oxide semiconductor can make the leak current low. By the way, the oxide semiconductors that are optically transparent and amorphous are called TAOS (Transparent Amorphous Oxide Semiconductor). The examples of TAOS are IGZO (Indium Gallium Zinc Oxide), ITZO (Indium Tin Zinc Oxide), ZnON (Zinc Oxide Nitride), IGO (Indium Gallium Oxide), and so on. In the present invention, IGZO is used as the oxide semiconductor. The oxide semiconductor may be called as TAOS in this specification.

In FIG. 2, the undercoat 101 is formed on the TFT substrate 100, which is formed either by glass or resin. If the liquid crystal display device is intended to be a flexible display device, the TFT substrate 100 is formed by resin as e.g. polyimide. Glass also can be flexibly bendable if its thickness becomes 0.2 mm or less.

In many cases, the undercoat 101 is made of a laminated film of the SiN film and the SiO film. The laminated film can be a two layer structure of the SiN film and the SiO film or the structure that the SiN film is sandwiched by the SiO films. The role of the SiO film is to block impurities from the glass substrate and the like. Another role of the SiO film is to improve adhesive strength between the TFT substrate 100 and films formed on the TFT substrate 100. The SiN film blocks impurity, especially moisture, from the glass substrate 100 and the like.

The TFT is formed on the undercoat 101; the TFT in FIG. 2 is a so called dual gate type TFT. Namely, a first gate electrode 102 is formed under the semiconductor layer 104 and the second gate electrode 106 is formed above the semiconductor layer 104. The first gate electrode 102 is formed on the same layer as the scanning line 11 depicted in FIG. 1, or connects with the scanning line 11 via a through hole. The first gate electrode 102 is made of e.g. MoW alloy. If the electrical resistance of the first gate electrode 102 or the scanning line 11 is required to be low, the structure that an aluminum layer is sandwiched by titanium layers and the like is adopted. In the meantime, if the TFT is intended to be a top gate type, not a dual gate type, the first gate electrode 102 is not connected to the scanning line 11, and can work as a light stopping film for the oxide semiconductor layer 104.

The first gate insulating film 103 is formed on the first gate electrode 102. The first gate insulating film 103 is formed by an oxygen rich SiO layer, which supplies oxygens to the oxide semiconductor layer 104 formed on the first gate insulating film 103. The present invention has a characteristic in that oxygens are efficiently supplied to the oxide semiconductor layer 104 from the first gate insulating film 103

In FIG. 2, the oxide semiconductor layer 104, which constitutes the TFT, is formed on the first gate insulating film 103 by sputtering or the like. A thickness of the oxide semiconductor layer 104 is 5 nm to 100 nm. The oxide semiconductor layer 104 is formed all over the substrate, subsequently, it is patterned.

In FIG. 2, the aluminum oxide film (herein after AlO film in this specification) 50 is formed on the first gate insulating film 103 separated by a small distance d1 from the oxide semiconductor layer 104. The AlO film 50 is formed on all over the display area 20 except the area of the oxide semiconductor layer 104 is formed. AlO film 50 is formed by sputtering under the oxygen rich atmosphere. Therefore, a great amount of oxygens are implanted into the first gate insulating film, 103 during the AlO film 50 is being formed by sputtering.

The oxygens in the first insulating film 103 are enclosed in the first gate insulating film 103 by the AlO film 50 after the AlO film 50 is formed by sputtering on the first gate insulating film 103. The enclosed oxygens in the first gate insulating film 103 diffuse to the side of the oxide semiconductor 104; thus, the oxide semiconductor 104 is supplied with oxygens. Consequently, deoxidization of the oxide semiconductor 104 is avoided; as a result, the characteristics of the oxide semiconductor can be maintained stable. The distance d1 between the oxide semiconductor 104 and the AlO film 50 in FIG. 2 is due to a requirement of patterning accuracy of the AlO film 50 as explained later, thus, the distance d1 can be 10 microns or less, and preferably 1 micron or less; and the value of d1 is the smaller the better.

In FIG. 2, the second gate insulating film 105 is formed on the oxide semiconductor layer 104. The second gate insulating film 105, which is made of SiO, is formed all over the display area; then patterned to remain only on the channel region of the oxide semiconductor layer 104. The second gate electrode 106 is formed on the second gate insulating film 105. The second gate electrode 106 is either formed on the same layer as the scanning line 11 or connected with the scanning line 11 via a through hole. The second gate electrode 106, as the same as the first gate electrode 102, is made of e.g. MoW alloy; if the electrical resistance is required to be low, the structure that an aluminum (Al) layer is sandwiched by titanium (Ti) layers and the like is adopted.

In the present invention, since the first gate insulating film 103 bears a role to supply oxygens to the oxide semiconductor layer 104, the second gate insulating film 105 can be formed in focusing the characteristics as the gate insulating film. Namely, the second gate insulating film 105 is not necessarily formed as oxygen rich. If oxygens are rich in the SiO layer, insulating characteristics of the SiO film is deteriorated. Consequently, since a thickness of the second gate insulating film 105 can be thin in the present invention, the function of the TFT is more influenced by the top gate (second gate electrode) 106.

On the other hand, in the structure of FIG. 2, the first gate insulating film 103 is oxygen rich; the oxygens are supplied continuously from the area of the first gate insulating film 103 that is covered by the AlO film 50. Therefore, it is not necessary to make only the portion in the first gate insulating film 103 that contacts with the oxide semiconductor layer 104, extremely oxygen rich to supply oxygens to the oxide semiconductor layer 104; thus, the characteristics of the oxide semiconductor layer 104 can be maintained stable.

After the second gate electrode 106 is formed, and before the interlayer insulating film 107 is formed, the plasma treatment is applied to the surface of the oxide semiconductor layer 104 to deoxidize the oxide semiconductor layer 104 to give conductivity except the portion that the oxide semiconductor layer 104 is covered by the second gate insulating film 105. Consequently, the drain region and the source region are formed in the oxide semiconductor 104. After that, the interlayer insulating film 107 is formed to cover the second gate electrode 106, the oxide semiconductor layer 104, the AlO film 50, and so on. The interlayer insulating film 107 is made of SiO. If the interlayer insulating film 107 is made of two layer structure of the SiO film and the SiN film, the SiO film is disposed in the lower layer, which is nearer to the oxide semiconductor layer 104.

After that, through hole 120 and through hole 121 are formed in the interlayer insulating film 107. The drain electrode 108 is formed at the through hole 120, and the source electrode 109 is formed at the through hole 121. The drain electrode 108 connects with the video signal line 12, and the source electrode 109 connects with the pixel electrode 113.

The organic passivation film 110 is formed to cover the drain electrode 108, the source electrode 109 and the interlayer insulating film 107. The organic passivation film 110 is formed by photosensitive resin made of e.g. acrylic and the like. Since the organic passivation film 110 has a role as a flattening film, it is made as thick as 2 to 4 microns. The through hole 130 is formed in the organic passivation film 110 to connect the source electrode 109 and the pixel electrode 113.

In FIG. 2, the common electrode 111, which is made of the transparent conductive metal oxide film e.g. ITO (Indium Tin Oxide) film and the like is formed on the organic passivation film 110. The common electrode 111 is formed in common to the plural pixels. The capacitive insulating film 112 is formed to cover the common electrode 111; the pixel electrode 113 is formed on the capacitive insulating film 112. Since a storage capacitance is formed between the pixel electrode 113 and the common electrode 111 sandwiching the capacitive insulating film 112, the insulating film 112 between the pixel electrode 113 and the common electrode 111 is called the capacitive insulating film 112.

The alignment film 114, which is for initial alignment of the liquid crystal molecules 301, is formed to cover the pixel electrode 113 and the capacitive insulating film 112. The alignment film 114 gets alignment ability through either by rubbing process or by photo alignment process using polarized ultra violet rays. The photo alignment process has advantage in IPS (In Plane Switching) type liquid crystal display device.

A through hole is formed in the capacitive insulating film 112 in the through hole 130 in the organic passivation film 110 to make contact between the pixel electrode 113 and the source electrode 109. The pixel electrode 113 is formed as comb shaped or stripe shaped; when video signal is applied to the pixel electrode 113, the electrical line of force as depicted in FIG. 2 is generated between the pixel electrode 113 and the common electrode 111 to rotate the liquid crystal molecules 301; thus, a transmittance of the liquid crystal layer 300 is controlled.

In FIG. 2, the counter substrate 200 is disposed to sandwich the liquid crystal layer 300 between the TFT substrate 100. The counter substrate 200 also can be made of glass or resin, the same as the TFT substrate 100. The color filter 201 and the black matrix 202 are formed inside of the counter substrate 200. The color filter 201 is formed at the place corresponding to the pixel electrode 113 in a plan view, thus, color images are formed. The black matrix 202 is formed at the place corresponding to the through hole 130 and the TFT, thus, leak of light from the backlight is prevented.

The overcoat film 203 is formed to cover the color filter 201 and the black matrix 202. The overcoat film 203 prevents the liquid crystal layer 300 from being contaminated by pigments of the color filter 201. The alignment film 204 is formed over the overcoat film 203 for initial alignment of the liquid crystal molecules 301. It is the same as the alignment film 114 on the TFT substrate 100 in that the alignment film 204 gets alignment ability through either by rubbing process or by photo alignment process using polarized ultra violet rays.

Figure 3:
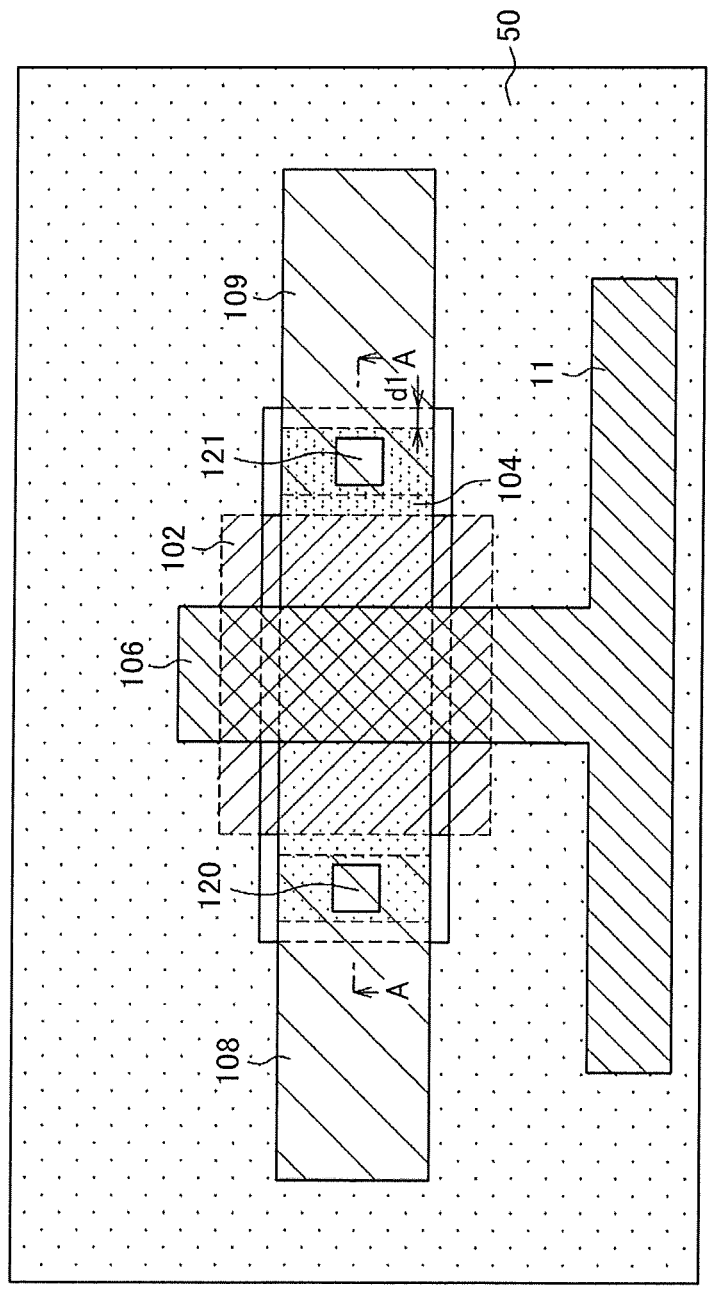
FIG. 3 is a plan view of the oxide semiconductor TFT.

FIG. 3 is a schematic plan view of the TFT in FIG. 2. In FIG. 3, the first gate electrode 102 is formed as the lowest layer. The first gate electrode 102 is connected to the scanning line 11 via the through hole at a place not shown in FIG. 2. The oxide semiconductor layer 104 and the AlO film 50 are formed over the first gate electrode 102 through the first gate insulating film 103. The oxide semiconductor layer 104 constitutes the TFT; the AlO film 50 has a role to confine oxygens in the first gate insulating film 103. The AlO film 50 is formed all over the display area 20 except the place where the oxide semiconductor layer 104 is formed. The distance d1 between the oxide semiconductor layer 104 and the AlO film 50 is determined by process requirement; the distance d1 is the smaller the better; concretely, 10 microns or less, preferably, 1 micron or less.

In FIG. 3, the second gate electrode 106 is formed over the oxide semiconductor layer 104 through the second gate insulating film 105. In FIG. 3, the second gate electrode 106 is formed on the same layer as the scanning line 11. The second gate electrode 106 is covered by the interlayer insulating film 107; the through hole 120 and through hole 121 are formed in the interlayer insulating film 107. The drain electrode 108 is formed to cover the through hole 120; the source electrode 109 is formed to cover the through hole 121.

Figure 4:
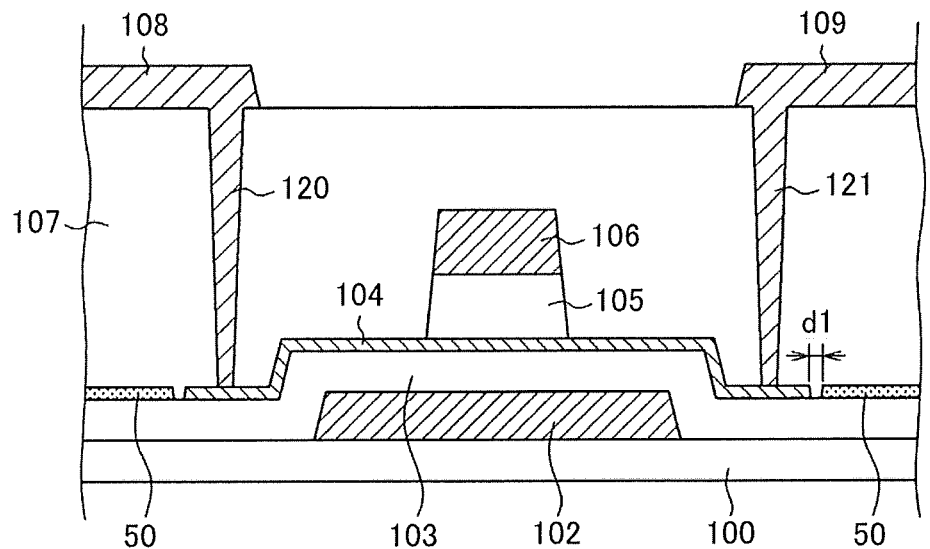
FIG. 4 is a cross sectional view of FIG. 3 along the line A-A.

FIG. 4 is a cross sectional view of FIG. 3 along the line A-A. FIG. 4 is an enlarged cross sectional view of the TFT portion; the undercoat 101 is not shown in FIG. 4. In FIG. 4, the first gate electrode 102 is formed on the TFT substrate 100; the first gate insulating film 103 is formed to cover the first gate electrode 102. The oxide semiconductor layer 104 is formed over the first gate electrode 102 through the first gate insulating film 103. The AlO film 50 is formed on the first gate insulating film 103 with a slight distance d1 to the oxide semiconductor layer 104. The AlO film 50 is formed all over the upper surface of the first gate insulating film 103 except the place where the oxide semiconductor layer 104 is formed.

Oxygens are implanted in the first gate insulating film 103 when the AlO film 50 is formed by sputtering; the oxygens are confined in the first gate insulating film 103 by the AlO film 50. The second gate insulating film 105 is formed on the oxide semiconductor layer 104; the second gate electrode 106 is formed on the second gate insulating film 105. The oxide semiconductor layer 104 is deoxidized by the plasma treatment to get conductivity except the region that the second gate electrode 106 and the second gate insulating film 105 are formed. The structures of the interlayer insulating film 107, drain electrode 108, the source electrode 109, and the like are the same as explained in FIG. 2.

In FIG. 4, oxygens confined in the first gate insulating film 103 diffuses to the oxide semiconductor layer 104 to prevent the oxide semiconductor layer 104 from being deoxidized; thus, the variation of characteristics of the oxide semiconductor layer 104 can be avoided for a long time. In the structure of FIG. 4, the first gate insulating film 103 is oxygen rich; in this case, oxygens are continuously supplied to the oxide semiconductor layer 104 from the area that the first gate insulating film 103 is covered by the AlO film 50. Therefore, for the purpose of stably supplying oxygens to the oxide semiconductor layer 104, it is not necessary to make extremely oxygen rich only in the region that the first gate insulating film 103 contacts the oxide semiconductor layer 104. Thus, the characteristics of the semiconductor layer 104 can be maintained in stable.

On the other hand, the second gate insulating film 105, which is formed on the oxide semiconductor layer 104, is not necessarily a source of oxygens for the oxide semiconductor layer 104; thus, the second gate insulating film 105 can be formed focused in having a good insulating characteristic. Therefore, a thickness of the second gate insulating film 105 can be thin.

Figure 5:
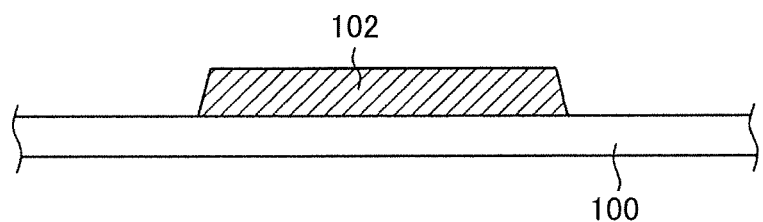
FIG. 5 is a cross sectional view that the first gate electrode is formed.
Figure 6:
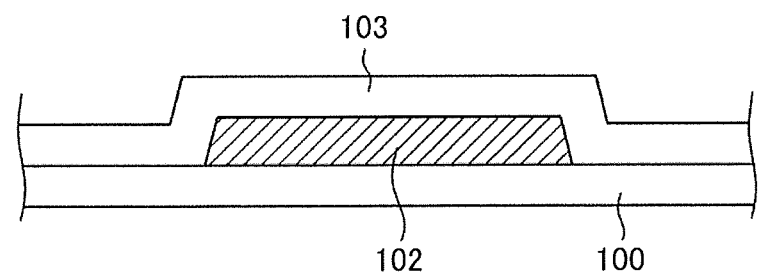
FIG. 6 is a cross sectional view that the first gate insulating film is formed.

FIGS. 5 through 10 are the interim cross sectional views in the processes to realize the structure of FIG. 4. In FIGS. 5 through 10, the undercoat is not shown. FIG. 5 is a cross sectional view that the first gate electrode 102 is formed on the TFT substrate 100. FIG. 6 is a cross sectional view that the first gate insulating film 103 is formed to cover the first gate electrode 102 and the TFT substrate 100. The first gate insulating film 103 is made of SiO.

Figure 7:
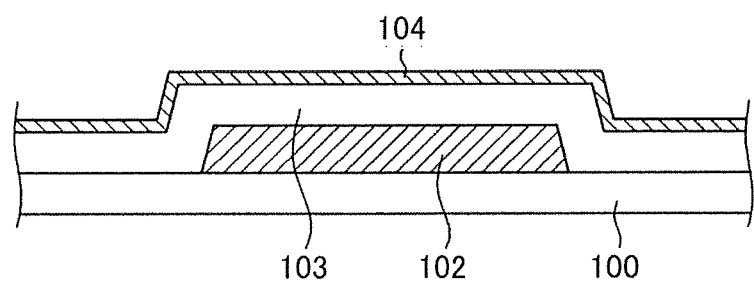
FIG. 7 is a cross sectional view that the oxide semiconductor layer is deposited.
Figure 8:
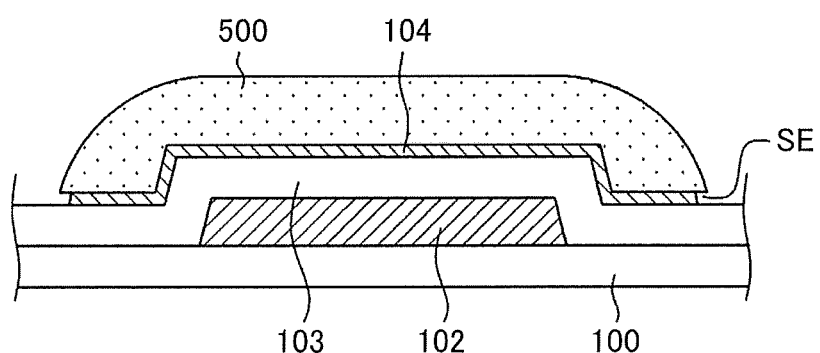
FIG. 8 is a cross sectional view that the oxide semiconductor layer is patterned.

After that as depicted in FIG. 7, the oxide semiconductor layer 104 is formed on the first gate insulating film 103. The oxide semiconductor layer 104 is formed by e.g. sputtering in thicknesses of 5 nm to 100 nm. FIG. 8 is a cross sectional view that the oxide semiconductor layer 104 is patterned with the photo resist 500. The oxide semiconductor layer 104 is patterned by wet etching; at this time, the side etching as shown by SE is generated.

Figure 9:
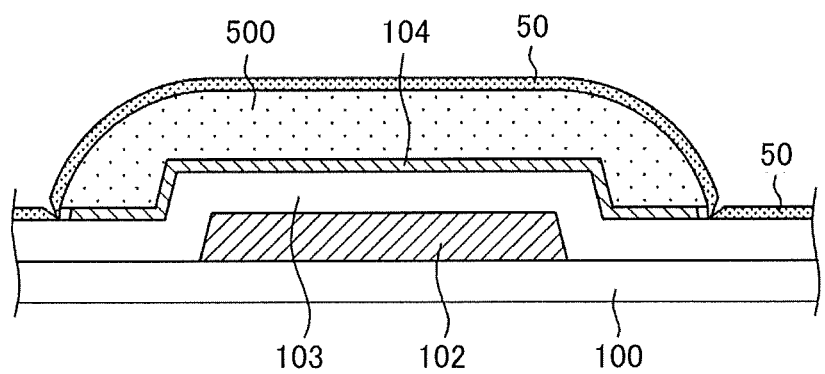
FIG. 9 is a cross sectional view that the aluminum oxide film is deposited.

FIG. 9 is a cross sectional view that the AlO film 50 is formed by sputtering in thicknesses of 1 nm to 50 nm on the structure of FIG. 8, and formed on all over the display area in the same manner. That means the AlO film 50 is formed on the on the resist 500, too. During the AlO film 50 is formed by sputtering, a great amount of oxygens are implanted in the first gate insulating film 103 except the portion that is covered by the resist 500. After that, when the resist 500 is removed as depicted in FIG. 10, the AlO film, 50, which is formed on the resist 500, is also removed.

During the sputtering of the AlO film 50, a thickness of the AlO film 50 tends to be locally thin under the edge of the resist, even though the shape is not stable, because of the side etching SE of the oxide semiconductor layer 104; consequently, a void tends to be formed at this position. Therefore, an edge of the AlO film 50 tends to be reversed taper.

Figure 10:
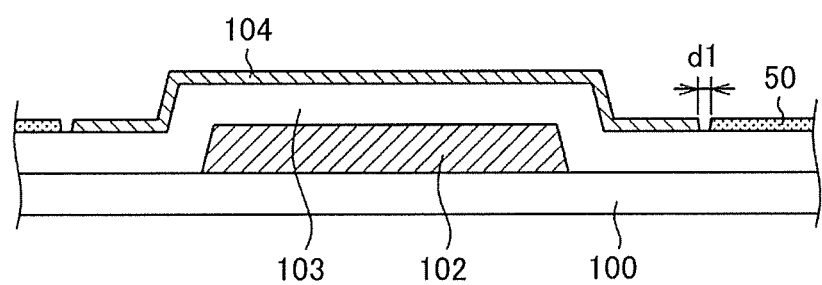
FIG. 10 is a cross sectional view that the photo resist is removed.

In FIG. 10, the gap d1, corresponding to the side etch SE formed when the oxide semiconductor layer 104 is patterned by etching, is formed between the oxide semiconductor layer 104 and the AlO film 50. If d1 is big, oxygens that diffuse in the first gate insulating film 103 escape from the gap d1 to the outside; consequently, the oxygens that reach the oxide semiconductor layer 104 decrease. Thus, the gap d1 is smaller the better if the process allows. The gap d1 is 10 microns or less, and preferably 1 micron or less if the process allows. After that, the second gate insulating film 105, the second gate electrode 106, the interlayer insulating film 107, the through hole 120, 121, the drain electrode 108 and the source electrode 109 are formed to complete the structure of FIG. 4.

Figure 11:
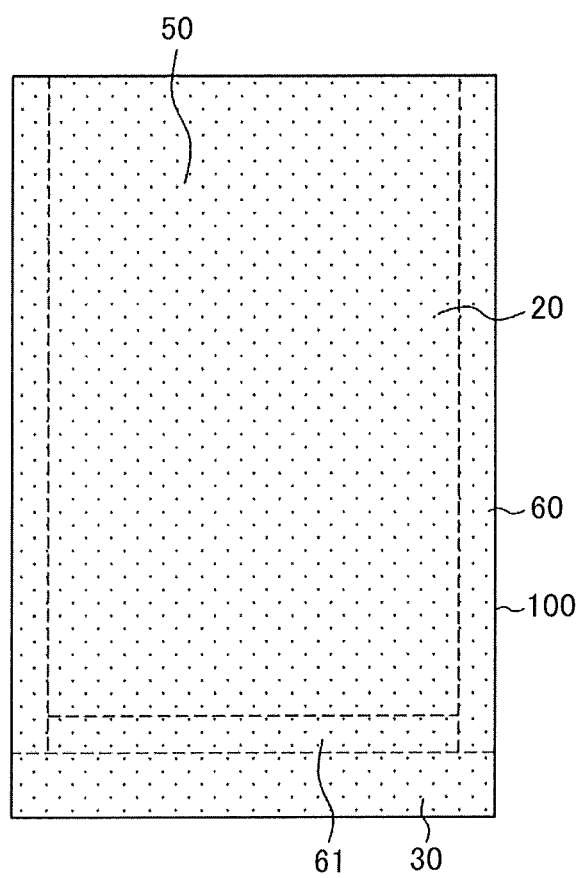
FIG. 11 is a plan view that the aluminum oxide film is formed on the TFT substrate.

FIG. 11 is a plan view that the AlO film 50 is formed by sputtering on all over the TFT substrate 100. In FIG. 11, broken lines indicate the areas that the scanning line driving circuit area 60, the control circuit area 61 and the terminal area 30 are to be formed; however, those structures are not formed yet when the AlO film 50 is being sputtered.

Figure 12:
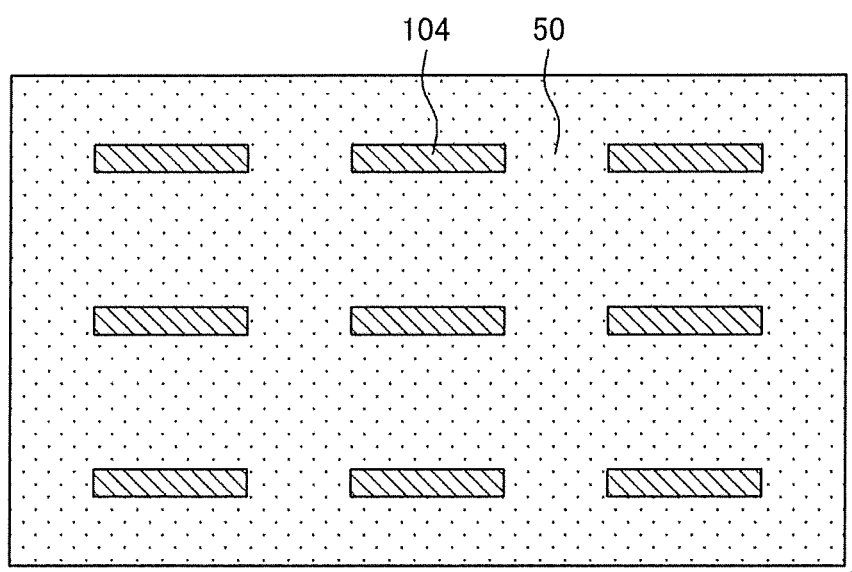
FIG. 12 is a plan view of the display area that the aluminum oxide film is patterned.

FIG. 12 is a plan view that shows the AlO film 50, which is formed all over the display area, is removed from the area that the oxide semiconductor 104 is formed. In other words, the AlO film 50 covers all the area except the place where the oxide semiconductor 104 is formed.

As described above, according, to the present invention, the first gate insulating film 103 can contain a great amount of oxygens in it when the AlO film 50 is formed by sputtering on the first gate insulating film 103; further, the oxygens can be confined in the first gate insulating film 103 by the sputtered AlO film 50, which is formed to cover the first gate insulating film 103. Further, the oxygens confined in the first gate insulating film 103 diffuse in the first gate insulating film 103 to supply the oxygens to the oxide semiconductor layer 104; thus, variations of the characteristics of the oxide semiconductor layer 104 can be efficiently suppressed.

Embodiment 2

Figure 13:
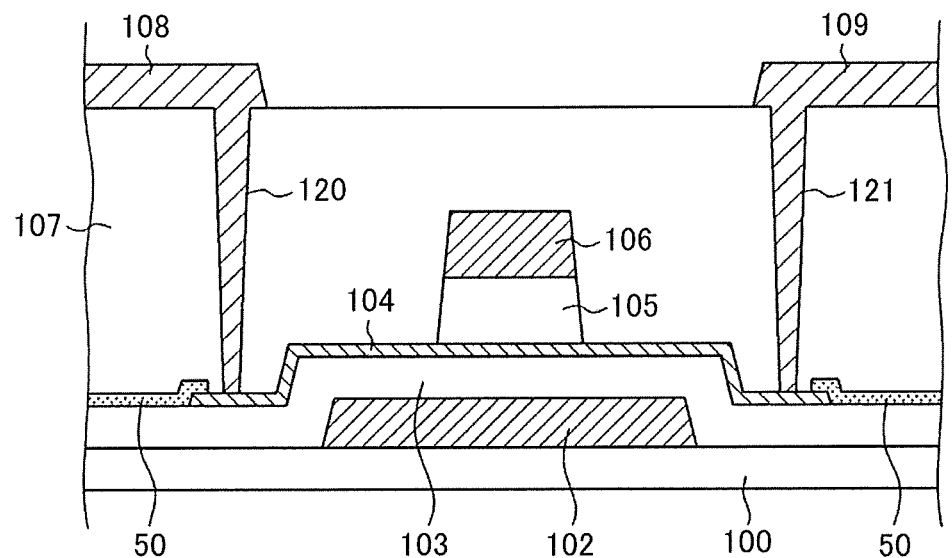
FIG. 13 as a cross sectional view of the first example of the embodiment 2.

FIG. 13 is a cross sectional view that shows the embodiment 2. FIG. 13 differs from FIG. 4 of the embodiment 1 in that no gap exists between the oxide semiconductor layer 104 and the AlO film 50, but the edge of the AlO film 50 is laid over the edge of the oxide semiconductor layer 104. If there is no gap between the AlO film 50 and the oxide semiconductor layer 104, the oxygens in the first gate insulating film 103 cannot escape through the gap between the AlO film 50 and the oxide semiconductor layer 104; thus, oxygens are efficiently supplied to the oxide semiconductor layer 104.

The structure of FIG. 13 is formed as that: the oxide semiconductor layer 104 is formed and patterned, then the resist 500 is removed; after that the AlO film 50 is formed by sputtering, then, the AlO film 50 is patterned by photolithography. Namely, the number of times of the photolithography is one time more than the structure of the embodiment 1. Other processes are the same as explained in the embodiment 1.

Figure 14:
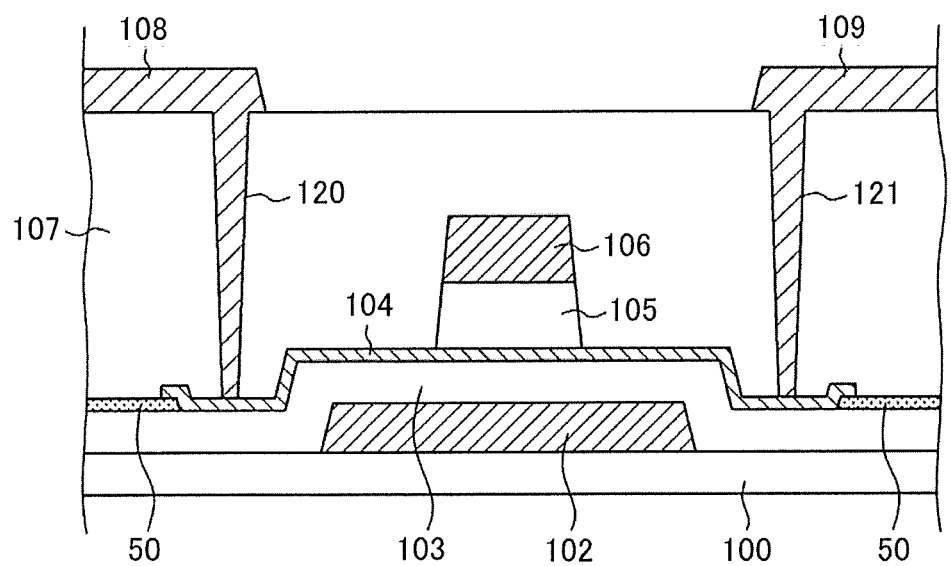
FIG. 14 is a cross sectional view of the second example of the embodiment 2.

FIG. 14 is cross sectional view of another example of the embodiment 2. The structure of FIG. 14, too, features that there is no gap between the AlO film 50 and the oxide semiconductor 104; however, FIG. 14 differs from FIG. 13 in that the edge of the oxide semiconductor layer 104 is laid over the edge of the AlO film 50. In other words, forming and patterning of the AlO film 50 are made first, then, forming and patterning of the oxide semiconductor layer 104 are made. FIG. 14 is the same as FIG. 13 in that the number of times of the photolithography is one time more than the structure of the embodiment 1. In addition, the structure of FIG. 14 has the same effect as that of FIG. 13.

Embodiment 2

In the embodiment 1, the TFT is dual gate type. The present invention, however, can be also applied when the TFTs are top gate type or bottom gate type. The top gate type is conceived as that the first gate electrode 102 in the embodiment 1 is not a gate electrode but is a light shielding film in the embodiment 2. Therefore, the bottom gate type TFT is explained in this embodiment.

Figure 15:
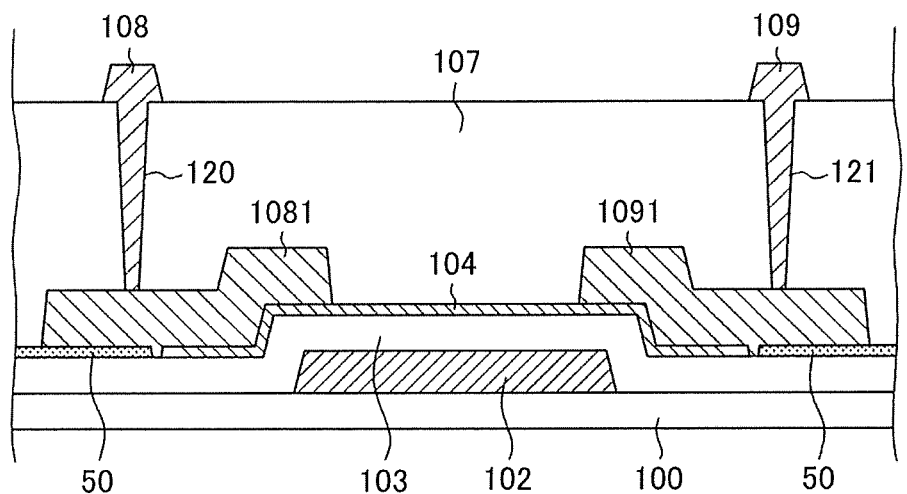
FIG. 15 is a cross sectional view of the embodiment 3.

FIG. 15 is a cross sectional view that the present invention is applied to the bottom gate type TFT. In FIG. 15, the undercoat is not shown. In FIG. 15, the first gate electrode 102 is formed on the TFT substrate 100. The first gate insulating film 103 is formed to cover the first gate electrode 102. The oxide semiconductor layer 104 is formed over the first gate electrode 102 through the first gate insulating film 103. The AlO film 50 is formed on the first gate insulating film 103 except the area where the oxide semiconductor layer 104 is formed. The oxygens in the first gate insulating film 103 are encapsulated by the AlO film 50.

After that, the drain metal 1081 and the source metal 1091 are formed to cover the edges of the oxide semiconductor layer 104. The drain metal 1081 and the source metal 1091 are formed by the same material as the drain electrode 108 or the source electrode 109 e.g. made of e.g. the structure that an aluminum film is sandwiched by titanium films. The oxygens are extracted from the oxide semiconductor layer 104 at the portion where the drain metal 1081 and the source metal 1091 contacts; thus, the oxide semiconductor layer 104 is conductive at this portion. In FIG. 15, the drain metal 1081 and the source metal 1091 partially overlap with the first gate electrode 102 in a plan view.

In FIG. 15, the second gate insulating film and the second gate electrode don't exist over the oxide semiconductor layer 104. Namely, the TFT is made ON or OFF only by the first gate electrode 102. In FIG. 15, the interlayer insulating film 107 is formed to cover the oxide semiconductor layer 104, the drain metal 1081 and the source metal 1091; the through holes 120 and 121 are formed in the interlayer insulating film 107; subsequently, the drain electrode 108 and the source electrode 109 are formed in the through hole 120 and through hole 121 respectively.

The merit of FIG. 15 is that; the through holes 120 and 121, which are formed in the interlayer insulating film 107, is formed on the drain metal 1081 or the source metal 1091; thus, the drain region or the source region of the oxide semiconductor layer 104 don't disappear when the through holes 120 and 121 are formed. On the contrary, in the embodiment 1, as depicted in FIG. 4, the through holes 120 and 121 are formed on the thin oxide semiconductor layer 104, thus, there is a danger that the oxide semiconductor layer 104 at the corresponding portion disappears according to the condition of etching. In this point, the structure of FIG. 15 has advantage for the production of the TFT with high yield.

In this embodiment too, the oxygens in the first insulating film is efficiently confined in the first gate insulating film 103 by the AlO film 50; thus, the oxygens are effectively supplied to the oxide semiconductor layer 104. Therefore, a reliability of the TFT constituted by the oxide semiconductor layer 104 can be improved.

Embodiment 4

The present invention is applicable to so called hybrid type liquid crystal display device, in which the TFT of the oxide semiconductor and the TFT of the poly silicon are formed on the same TFT substrate 100. Since the oxide semiconductor 104 has a less leak current, it is suitable for the switching TFT in the pixel; since the poly silicon has high mobility, it is suitable for the TFT that is used in the driver circuit, which is built in on the TFT substrate 100.

Figure 16:
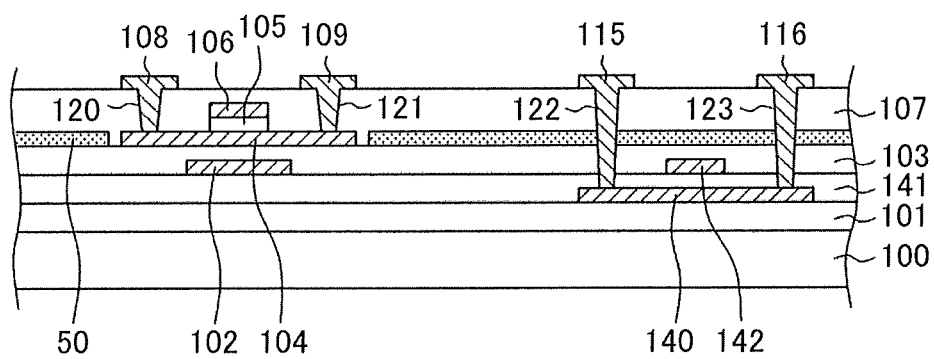
FIG. 16 is a cross sectional view of the embodiment 4.

FIG. 16 is a cross sectional view that the TFT of the oxide semiconductor 104 and the TFT of the poly silicon 140 are formed on the same TFT substrate 100. In FIG. 16, the undercoat 101 is formed on the TFT substrate 100. The structure of the undercoat 101 is the same as explained in FIG. 2. The semiconductor layer of poly-silicon 140 is formed on the undercoat 101. The poly silicon layer 140 is formed as that: the a-Si (amorphous silicon) layer is formed by CVD, then the a-Si layer is transformed to the poly silicon layer 140 by applying excimer laser on the a-Si layer. Such a poly silicon is called LTPS (Low Temperature Poly-Si). The poly silicon layer 140 of FIG. 16 is formed by patterning the LTPS. In the meantime, some products use a-Si film, as at is, for the TFTs.

The third gate insulating film 141 is formed by SiO covering the LTPS 140; the third gate electrode 142 is formed on the third gate insulating film 141. The first gate electrode 102 for the TFT of the oxide semiconductor 104 is formed simultaneously with the third gate electrode 142. In the meantime, in some products, the first gate electrode 102 is used as a light shielding film, not the gate electrode. In that case, the gate voltage is not applied to the first gate electrode 102 so that it works only to shield the light from the back light.

The first gate insulating film 103, made of SiO, is formed over the third gate electrode 142 of the poly silicon TFT and the first gate electrode 102 of the oxide semiconductor TFT. In the oxide semiconductor TFT side, the oxide semiconductor layer 104 is formed and patterned. After that, the AlO film 50 is formed on the first gate insulating film 103 except the area the oxide semiconductor layer 104 is formed. The process to form the AlO film 50 is the same as explained in FIG. 7 to FIG. 10.

As explained in the embodiment 1, oxygens are confined in the first gate insulating film 103 by the AlO film 50; and the oxygens are efficiently supplied to the oxide semiconductor layer 104. In the meantime, the AlO film 50 is also formed on the first gate insulating film 103 in the side of the poly silicon TFT; however, this AlO film 50 does not have impact to the poly silicon TFT. In the poly silicon TFT side, through holes 122 and 123 are formed; the drain electrode 115 and the source electrode 116 are formed respectively in those through holes.

FIG. 16 is an example that the structure of the embodiment 1 is applied to the hybrid structure on the TFT substrate 100; however, structures of the embodiment 2 and embodiment 3 are also applicable to the structure of the embodiment 4. As described above, the present invention, explained in the embodiment 1 and the other embodiments, can be applied to the liquid crystal display device that has hybrid type TFTs on the TFT substrate; consequently, the oxide semiconductor TFTs of high reliability can be formed in the hybrid type structure.

Embodiment 5

Figure 17:
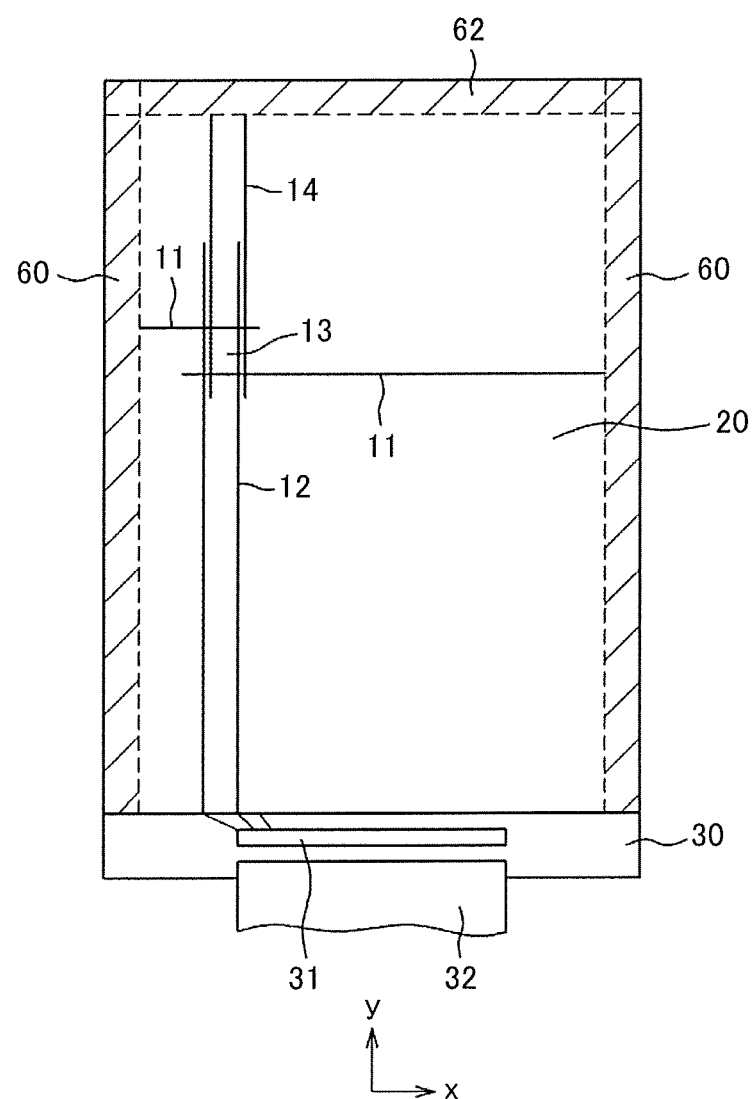
FIG. 17 is a plan view of the organic EL display device.

The embodiment 1 through embodiment 4 explains the examples when the present invention is applied to the liquid crystal display device. The present invention, however, can be applied to the organic EL display device. FIG. 17 is a plan view of an example of the organic EL display device. In FIG. 17, the organic EL display device has the display area 20 and the terminal area 30. In the display area 20, the scanning lines 11 extend in the lateral direction (x direction) and are arranged in the longitudinal direction (y direction). The video signal lines 12 and the power lines 14 extend in the longitudinal direction (y direction), and are arranged in the lateral direction (x direction). The power lines 14 supply current to the organic EL layer in each of the pixels. The pixel 13 is formed in the area surrounded by the scanning lines 11 and the video signal lines 12.

In FIG. 17, the scanning line driver circuits 60 are formed at both sides of the display area 20; the current supply area 62 is formed at the upper side (y direction) of the display area 20. The driver IC 31, which includes video signal line driver circuit, is installed on the terminal area 30. The flexible wiring circuit substrate 32, which supplies power and signals to the organic EL display device, connects to the terminal 30.

Figure 18:
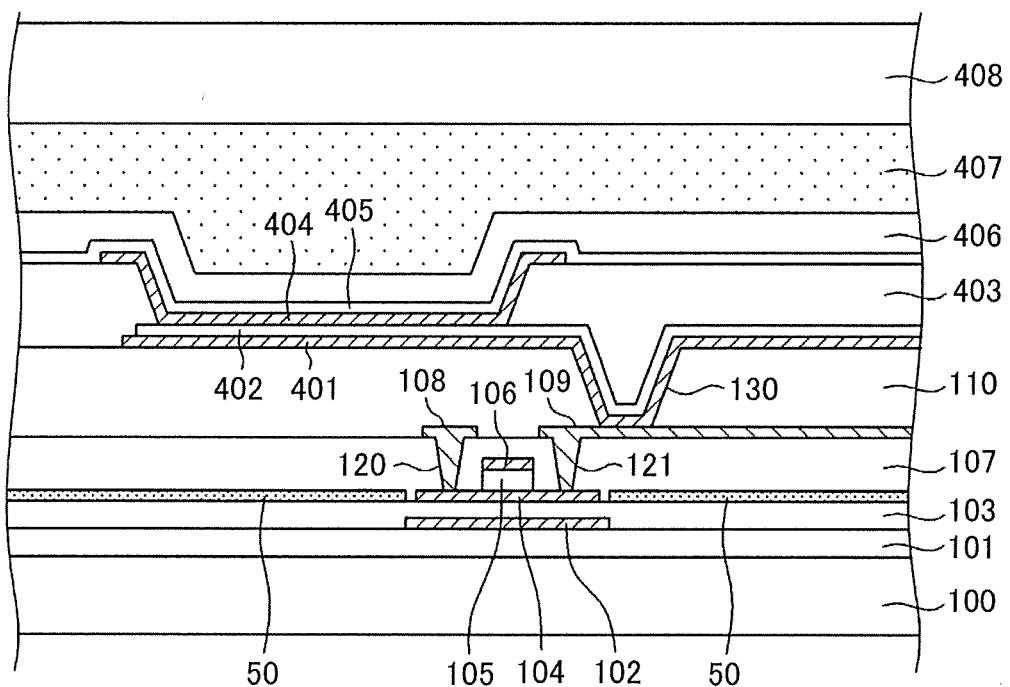
FIG. 18 is a cross sectional view of the display area of the organic EL display device, which the present invention is applied.

FIG. 18 is a cross sectional view of the display area 20 of the organic EL display device. FIG. 18 is a cross sectional view at the place where the organic EL layer and the driving TFT to drive the organic EL layer are formed. In FIG. 18, the undercoat 101 is formed on the TFT substrate 100; the first gate electrode 102 is formed on the undercoat 101; the first gate insulating film 103 is formed by SiO to cover the first gate electrode 102. The oxide semiconductor layer 104 is formed over the gate electrode 102 through the gate insulating film 103.

The AlO film 50 is formed on the gate insulating film 103 except the place where the oxide semiconductor layer 104 is formed. As described in the embodiment 1, the role of the AlO film 50 is to encapsulate oxygens in the oxygen rich first gate insulating film 103 so that the oxygens are efficiently supplied to the oxide semiconductor layer 104. The manufacturing method of the AlO film 50 and a thickness of the AlO film 50 and the like are the same as explained in the embodiment 1.

After that, the second gate insulating film 105 is formed on the oxide semiconductor layer 104; the second gate electrode 106 is formed on the second gate insulating film 105. The interlayer insulating film 107 is formed to cover the oxide semiconductor layer 104 and the AlO film 50. The through holes 120 and 121 are formed in the interlayer insulating film 107; the drain electrode 108 is formed in the through hole 120 and the source electrode 109 is formed in the through hole 121. The organic passivation film 110 is formed to cover the drain electrode 108 and the source electrode 109; the through hole 130 is formed in the organic passivation film 110 to connect the source electrode 109 and the anode 402. As described above, up to the through hole 130 is formed in the organic passivation film 110, the structure of the organic EL display device is the same as the liquid crystal display device.

In FIG. 18, the reflection electrode 401 and the anode 402 are formed in lamination on the organic passivation film 110. The reflection electrode 401 is made of e.g. a thin silver film; the anode 402 is made of ITO. The reflection electrode 401 and the anode 402 are also called lower electrode. The lower electrodes 401 and 402 connect with the source electrode via the through hole 130. In the meantime, to improve the adhesion between the organic passivation film 110 and a lamination film of the reflection electrode 401 and the anode 402, sometimes ITO is further formed under the reflection electrode 401.

The bank 403 is formed to cover the edges of the lower electrode 401, 402. The role of the bank 403 is to partition the pixels, and to prevent the organic EL layer 404, which is formed on the lower electrode 401, 402, from getting disconnection due to the step of the lower electrode 401, 402. In FIG. 18, the organic EL layer 404 is formed on the anode 402. The organic EL layer 404 comprises plural layers of the hole injection layer, the hole transportation layer, the light emitting layer, the electron transportation layer and the electron injection layer in an order from the anode 402.

In FIG. 18, the upper electrode 405, which is to be the cathode, is formed on the organic EL layer 404. The upper electrode 405 is made of the transparent conductive film like IZO (Indium Zinc Oxide), ITO (Indium Tin Oxide) and the like; or sometimes it is made of a thin metal, like e.g. silver. Since the organic EL layer 404 is decomposed by moisture, the protection layer 406 is formed by e.g. SiN covering the upper electrode 405 to prevent an intrusion of moisture. After that, the polarizing plate 408 is attached on the protection layer 406 through the adhesive 407. The polarizing plate 408 is used to prevent the reflection of external light.

FIG. 18 is an example that the structure of the embodiment 1 is applied to the organic EL display device; however, the structures of embodiments 2 through 4 are also applicable to the organic EL display device.

As described above, the structure of the oxide semiconductor TFT and the structure vicinity to the oxide semiconductor TFT in the organic EL display device can be made the same as that of the liquid crystal display device. Therefore, oxygens in the SiO film under the oxide semiconductor layer 104 can be encapsulated by the AlO film 50, consequently, oxygens are efficiently supplied to the oxide semiconductor layer 104. Thus, the organic EL display device of less variation in characteristics can be realized.

What is claimed is:

1. A display device having a TFT substrate that includes a TFT having an oxide semiconductor layer comprising:
   the oxide semiconductor layer is formed on a first insulating film that is formed by a silicon oxide layer,
   the oxide semiconductor layer and an aluminum oxide film are directly formed on the first insulating film,
   wherein the oxide semiconductor layer and the aluminum oxide film do not overlap to each other in a plan view,
   wherein a gap of a width of 10 microns or less is formed between the oxide semiconductor layer and the aluminum oxide film,
   wherein an edge of the aluminum oxide film is reverse tapered in a cross sectional view.

2. The display device according to claim 1,
   wherein a first gate electrode is formed under the oxide semiconductor layer and the first insulating film in a cross sectional view,
   the first insulating film works as a gate insulating film.

3. The display device according to claim 2,
wherein the first gate electrode works as a light stopping film.

4. The display device according to claim 2,
wherein a second insulating film made of silicon oxide is formed on the oxide semiconductor layer,
a second gate electrode is formed on the second insulating film.

5. The display device according to claim 4,
wherein the second insulating film is formed only on a channel of the oxide semiconductor layer which constitutes the TFT.

6. The display device according to claim 2,
wherein a drain electrode contacts a first edge of the oxide semiconductor layer, a source electrode contacts a second edge, which opposes to the first edge, of the oxide semiconductor layer,
a part of the drain electrode and a part of the source electrode overlap with the first gate electrode in a plan view.

7. The display device according to claim 1,
wherein a TFT having a polysilicon layer is further formed on the TFT substrate.

8. The display device according to claim 7,
a third gate electrode, which constitutes the TFT having the polysilicon layer, and a first gate electrode, which constitutes the TFT having the oxide semiconductor layer, are formed on a same layer.

9. The display device according to claim 1,
the display device is a liquid crystal display device.

10. The display device according to claim 1,
the display device is an organic EL display device.

11. A manufacturing method of a display device comprising:
forming a first insulating film by silicon oxide on a substrate,
forming an oxide semiconductor layer on the first insulating film,
forming photo resist on the oxide semiconductor layer, and patterning the oxide semiconductor layer, forming by sputtering an aluminum oxide film on the photo resist, which is on the oxide semiconductor layer, and the first insulating film,
after that, removing the photo resist to separate the oxide semiconductor layer and the aluminum oxide film to each other wherein the oxide semiconductor layer and the aluminum oxide film do not overlap to each other in a plan view,
forming a gap of a width of 10 microns or less between the oxide semiconductor layer and the aluminum oxide film.

12. The manufacturing method of the display device according to claim 11,
wherein a side etching under the photo resist is formed in the oxide semiconductor layer during patterning of the oxide semiconductor layer.

13. The manufacturing method of the display device according to claim 12,
wherein the gap is formed between the oxide semiconductor layer and the aluminum oxide film at a place that the side etching is formed.

* * * * *